(12) United States Patent  
Melichar

(10) Patent No.: US 8,466,684 B2
(45) Date of Patent: Jun. 18, 2013

(54) DETERMINATION OF BATTERY PREDICTIVE POWER LIMITS

(75) Inventor: Robert J. Melichar, Troy, MI (US)

(73) Assignee: Chevron Technology Ventures LLC, Houston, TX (US)

( * ) Notice: Subject to any disclaimer, the term of this patent is extended or adjusted under 35 U.S.C. 154(b) by 1530 days.

(21) Appl. No.: 11/455,297

(22) Filed: Jun. 16, 2006

(65) Prior Publication Data

US 2008/0007224 A1    Jan. 10, 2008

(51) Int. Cl.
*H02J 7/00* (2006.01)

(52) U.S. Cl.
USPC .......................................... 324/426; 320/132

(58) Field of Classification Search
USPC .................. 320/132; 324/426; 702/63, 64, 65
See application file for complete search history.

(56) References Cited

U.S. PATENT DOCUMENTS

| 6,448,776 | B2 | 9/2002 | Meissner et al. |
| 6,885,951 | B2 | 4/2005 | Richter |
| 2004/0162683 | A1* | 8/2004 | Verbrugge et al. ............... 702/64 |
| 2004/0178798 | A1* | 9/2004 | Kikuchi et al. ............... 324/426 |
| 2005/0110498 | A1* | 5/2005 | Plett ............................. 324/433 |
| 2006/0087291 | A1 | 4/2006 | Yamauchi ..................... 320/137 |
| 2007/0052423 | A1* | 3/2007 | Arai ............................. 324/429 |

FOREIGN PATENT DOCUMENTS

CN        1581629 A    2/2005

* cited by examiner

*Primary Examiner* — Ramy Ramadan
(74) *Attorney, Agent, or Firm* — Harness, Dickey & Pierce, P.L.C.

(57) ABSTRACT

A battery control module for use with a battery includes a voltage measuring module that measures battery voltage and a current measuring module that measures battery current. A power limit module communicates with the current and voltage measuring modules and once every time period estimates a battery current limit that corresponds with a future time period. The battery current limit is based on a predetermined voltage limit of the battery and a battery current and a battery voltage that correspond with a time period that precedes the future time period.

24 Claims, 6 Drawing Sheets

DETERMINATION OF BATTERY PREDICTIVE POWER LIMITS

FIELD OF THE INVENTION

The present invention relates to battery systems, and more particularly to determining power delivery limits for battery systems.

BACKGROUND OF THE INVENTION

Battery systems may be used to provide power in a wide variety of applications. Exemplary transportation applications include hybrid electric vehicles (HEV), electric vehicles (EV), heavy duty vehicles (HDV) and vehicles with 42-volt electrical systems. Exemplary stationary applications include backup power for telecommunications systems, uninterruptible power supplies (UPS), and distributed power generation applications.

Examples of the types of batteries that are used include nickel metal hydride (NiMH) batteries, lead-acid batteries, and other types of batteries. A battery system may include a plurality of battery subpacks that are connected in series and/or in parallel. The battery subpacks may include a plurality of batteries that are connected in parallel and/or in series.

Inherent properties of a battery can dictate a minimum operating voltage specification ($V_{min}$) and/or a maximum operating voltage specification ($V_{max}$). In some applications $V_{min}$ and $V_{max}$ can be specified by engineers and based on other criteria. When taken together $V_{min}$ and $V_{max}$ indicate a voltage range that the battery voltage should be kept within to maximize the service life of the battery. $V_{min}$ and $V_{max}$ also infer limits on the battery's abilities to provide power during discharge and accept power during recharge. In some applications, such as HEVs, these limits on battery power can periodically limit the performance of the vehicle. For example, an HEV control system can limit the acceleration of the vehicle to keep the battery voltage above the minimum battery voltage $V_{min}$. The HEV control system can also limit a regenerative braking function of the vehicle to keep the battery voltage below the maximum battery voltage $V_{max}$ and thereby maintain some regenerative braking capacity.

One method of preventing the acceleration performance limit from occurring is to use an internal combustion engine to supplement the power delivered from the battery. Such a method introduces other issues, however. For example, the engine may be turned off when it is needed. In such a situation the vehicle performance will still be limited for a brief period while the HEV control system starts the engine.

A second method of preventing the performance limits is to leave the engine idling so that it is always available to supplement the battery power. However an idling engine wastes fuel and therefore does not provide an ideal solution. As such, there remains a need for predicting battery power limits and synchronizing supplemental power sources with load demands.

SUMMARY OF THE INVENTION

A battery control module for use with a battery includes a voltage measuring module that measures battery voltage and a current measuring module that measures battery current. A power limit module communicates with the current and voltage measuring modules and once every time period estimates a battery current limit that corresponds with a future time period. The battery current limit is based on a predetermined voltage limit of the battery and a battery current and a battery voltage that correspond with a time period that precedes the future time period.

A hybrid power supply system for a load includes a first power source that provides power to the load based on a power demand signal, a rechargeable battery that provides power to the load, and a control module in communication with the rechargeable battery. The control module includes a voltage measuring module that measures battery voltage, a current measuring module that measures battery current, and a power limit module that communicates with the current and voltage measuring modules. The power limit module estimates a battery current limit based on the battery current, the battery voltage, and a predetermined voltage limit of the battery. The power limit module generates the power demand signal based on the battery current limit.

A method for controlling current draw from a battery includes measuring a battery voltage, measuring a battery current, and periodically estimating a battery current limit that corresponds with a future time period and represents a maximum allowable battery current through the battery. The battery current limit is based on the measured battery current, the measured battery voltage, and a predetermined voltage limit of the battery.

A method for controlling a hybrid power supply system includes operating a first power source to provide power to a load based on a power demand signal, supplying power to the load from a rechargeable battery, measuring a battery voltage of the rechargeable battery, measuring a battery current of the rechargeable battery, periodically estimating a battery current limit that corresponds with a future time period and represents a maximum allowable battery current through the battery, and generating the power demand signal based on the estimated battery current limit. The battery current limit is based on the measured battery current, the measured battery voltage, and a predetermined voltage limit of the battery A powertrain system for a hybrid electric vehicle includes a rechargeable battery that provides power to an electric motor for propelling the vehicle, an internal combustion engine that generates power for propelling the vehicle, an engine controller that starts the internal combustion engine in response to a power demand signal, and a control module in communication with the rechargeable battery. The control module includes a voltage measuring module that measures battery voltage, a current measuring module that measures battery current, and a power limit module that communicates with the current and voltage measuring modules. The power limit module periodically determines a battery current limit corresponding to a future period and based on the battery current and the battery voltage. The power limit module generates the power demand signal based on the battery current limit such that the engine controller starts the internal combustion engine prior to the future period.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
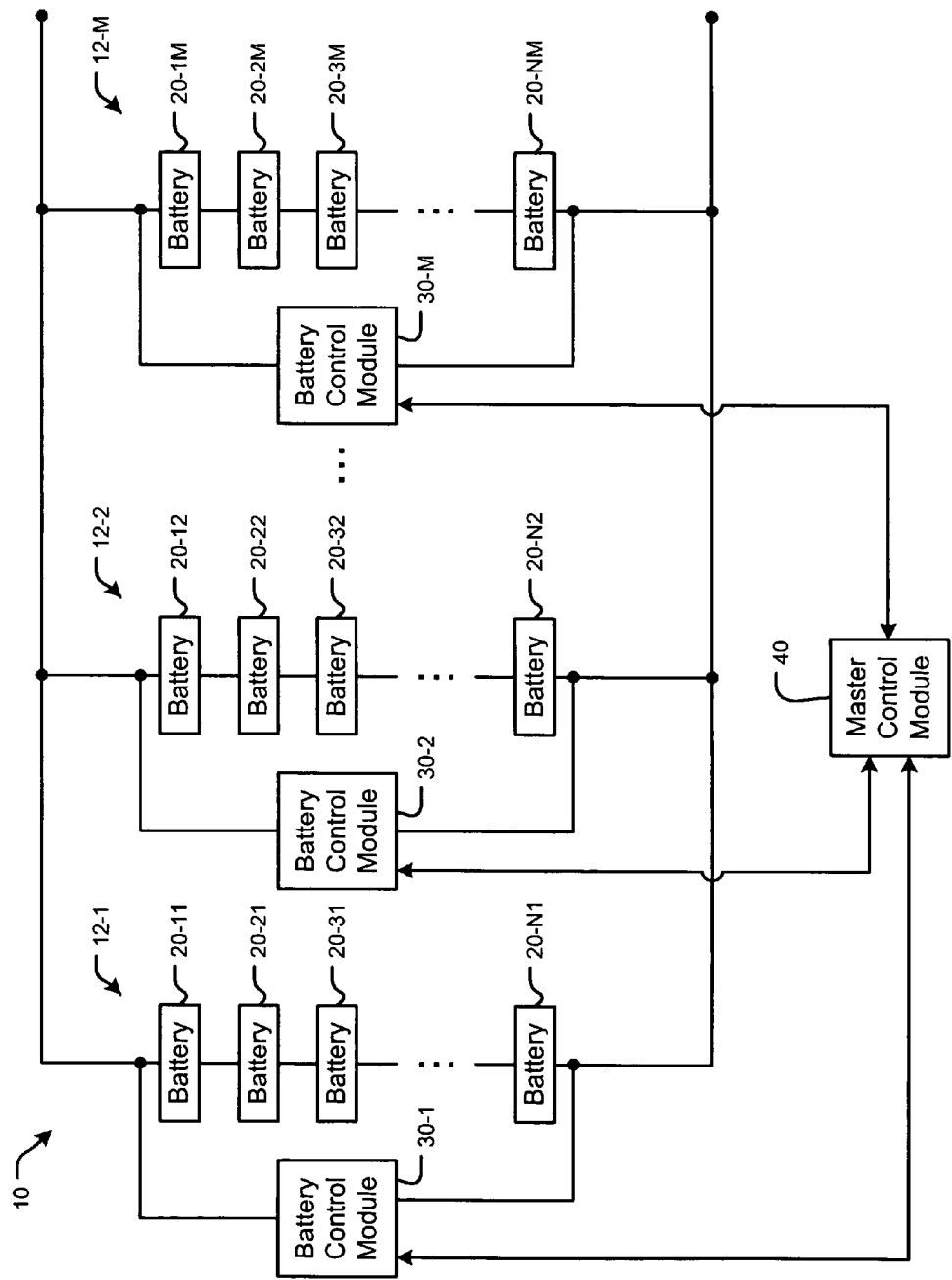
FIG. 1 is a functional block diagram of a battery system including battery subpacks, battery control modules and a master control module.

The following description of the preferred embodiment(s) is merely exemplary in nature and is in no way intended to limit the invention, its application, or uses. For purposes of clarity, the same reference numbers will be used in the drawings to identify the same elements. As used herein, the term module or device refers to an application specific integrated circuit (ASIC), an electronic circuit, a processor (shared, dedicated, or group) and memory that execute one or more software or firmware programs, a combinational logic circuit, and/or other suitable components that provide the described functionality.

An exemplary system that can be used to predict the maximum power output of a battery will be shown, although skilled artisans will appreciate that other systems may be used. Referring now to FIG. 1, an exemplary embodiment of a battery system 10 is shown to include M battery subpacks 12-1, 12-2, . . . , and 12-M (collectively battery subpacks 12). The battery subpacks 12-1, 12-2, . . . , and 12-M include N series connected batteries 20-11, 20-12, . . . , and 20-NM (collectively batteries 20). Battery control modules 30-1, 30-2, . . . and 30-M (collectively battery control modules 30) are associated with each of the battery subpacks 12-1, 12-2, . . . and 12-M, respectively. In some embodiments, M is equal to 2 or 3, although additional or fewer subpacks may be used. In some embodiments, N is equal to 12-24, although additional and/or fewer batteries may be used.

The battery control modules 30 sense voltage across and current provided by the battery subpacks 12. Alternatively, the battery control modules 30 may monitor one or more individual batteries 20 in the battery subpacks 12 and appropriate scaling and/or adjustment is performed. The battery control modules 30 communicate with a master control module 40 using wireless and/or wired connections. The master control module 40 receives the power limits from the battery control modules 30 and generates a collective power limit. The SOC can be calculated for each module, in groups and/or collectively. The battery control module 30 may be integrated with the master control module 40 in some embodiments.

Figure 2:
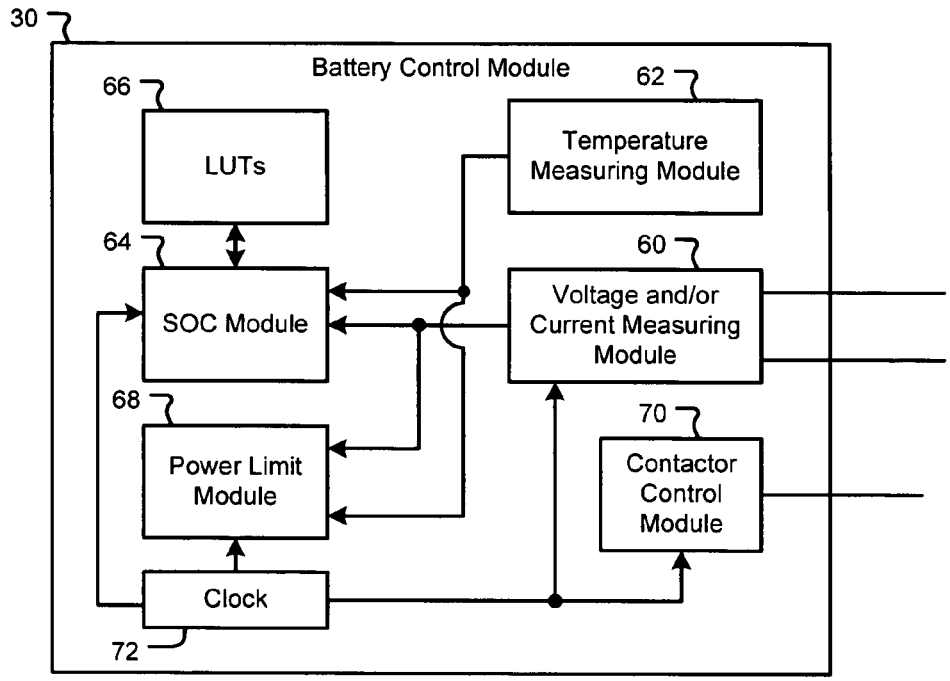
FIG. 2 is a functional block diagram of a battery control module.

Referring now to FIG. 2, some elements of the battery control modules 30 are shown. The battery control modules 30 include a voltage and/or current measuring module 60 that measures battery voltage and/or current of the battery subpack 12 and/or one or more individual batteries 20 in the battery subpack 12. A battery temperature sensing module 62 measures temperature at at least one location within battery subpack 12. A battery state of charge (SOC) module 64 periodically determines the SOC of the batteries 20 in the battery subpacks 12. SOC module 64 may employ a lookup table 66, formulas and/or other methods to determine the SOC.

A power limit module 68 predicts a maximum current limit $I_{LIM}$, battery voltage limit $V_{LIM}$, and/or power limit $P_{LIM}$ for the battery subpack 12 and/or one or more batteries 20 in the battery subpack 12, as will be described further below. A contactor control module 70 controls one or more contactors (not shown) that are associated with the control and/or connection of the batteries 20 in the battery subpacks 12. A clock circuit 72 generates one or more clock signals for one or more of the modules within the battery control module 30.

Figure 3:
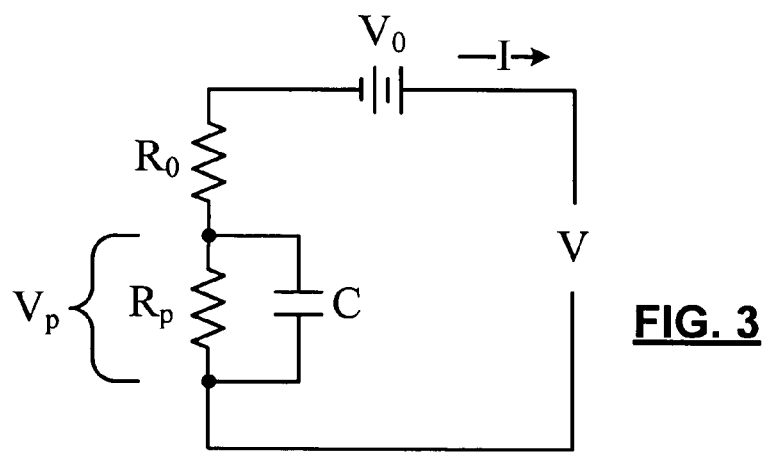
FIG. 3 is an equivalent circuit of a battery.

Referring now to FIG. 3, an equivalent circuit for the battery 20 is shown. A resistor $R_O$ represents ohmic resistance of the battery, a voltage $V_P$ represents a polarization voltage, a voltage $V_O$ represents an open circuit or relaxation voltage, a current I represents the battery current, and a voltage V represents the battery voltage. V and I are measured values. $R_p$ varies with temperature, duration of applied current and SOC. $V_O$ and $R_O$ vary primarily with SOC. When current I is steady state, $V_p$ is equal to measured current I times $R_p$. Using the equivalent circuit and Kirchoff's voltage rules for the battery 20, $V = V_O + V_p + IR_O$.

Figure 4:
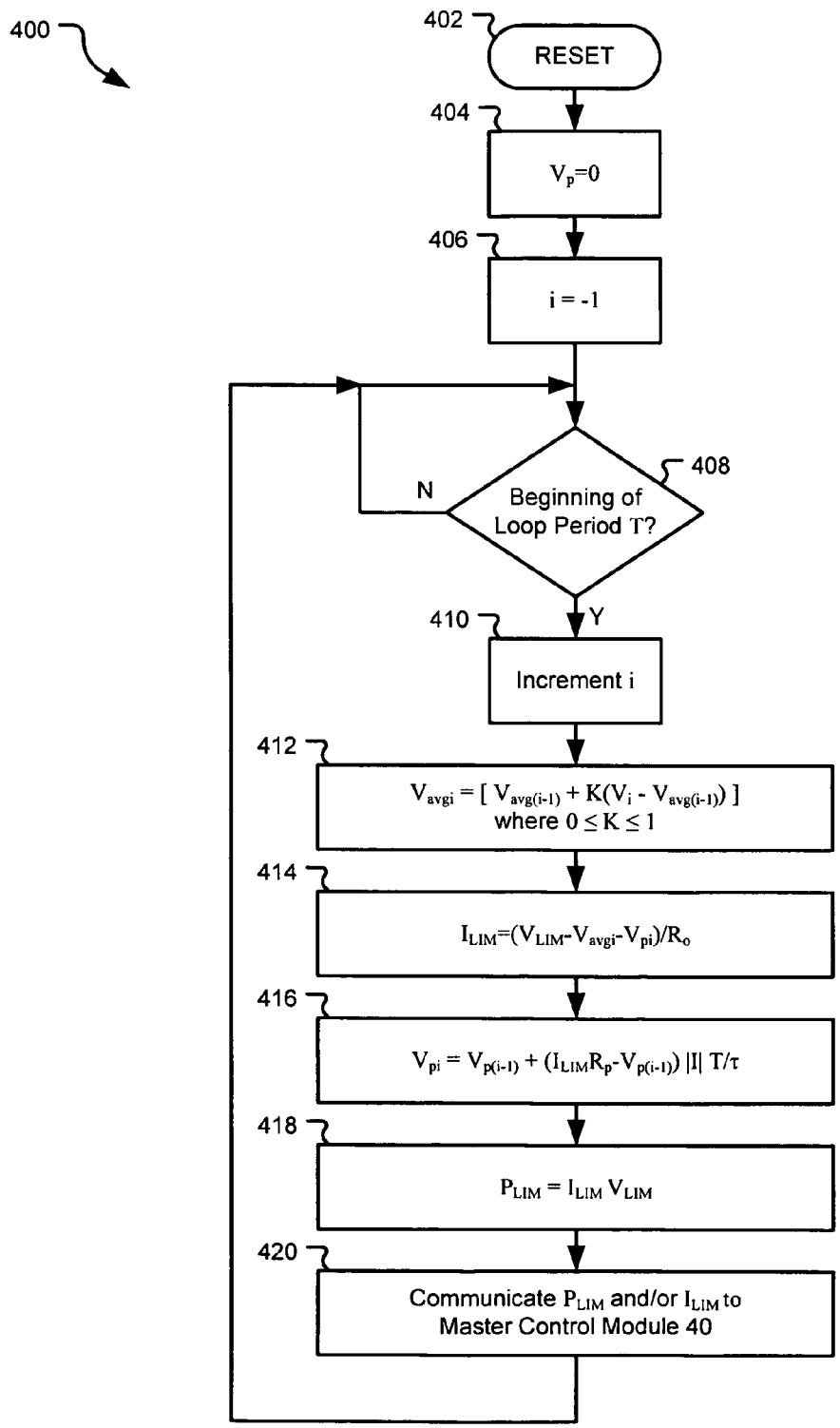
FIG. 4 is a flowchart of a method for predicting a power limit of a battery.

Referring now to FIG. 4, a flowchart is shown of a method 400 for predicting battery performance limits. Method 400 can be implemented as a computer program that is stored in a computer memory associated with a computer. The computer and computer memory can be included in the power limit module 68. Method 400 can be initiated each time battery system 10 is turned on.

Control begins in start block 402 and proceeds to block 404. In block 404 control initializes $V_p$ to zero. Control then proceeds to block 406 and initializes a loop counter i to −1. Control then proceeds to decision block 408 and determines whether a loop period T has lapsed. The loop period T determines an execution period of blocks 410-420. If the loop period T has not lapsed then control re-enters decision block 408 to wait for the beginning of the next loop period. Lapsing of the loop period can be determined from clock 72. An example value for loop period T is 100 mS, however it should be appreciated by those skilled in the art that other time periods can be used. Control branches to block 410 and increments the loop counter i upon determining that a new loop period T is starting.

Control proceeds from block 410 to block 412 and updates a running average battery voltage $V_{avgi}$ based on the equation:

$$V_{avgi} = [V_{avg(i-1)} + K(V_i - V_{avg(i-1)})],$$

where $0 \leq K \leq 1$, $V_i$ is the the measured battery voltage V corresponding to the loop count i, and $V_{avg(i-1)}$ is the value of the running average voltage corresponding to the previous loop period. The running average battery voltage $V_{avg}$ can be used as an approximation for the relaxation voltage $V_O$.

Control proceeds from block 412 to block 414 and predicts a battery current limit $I_{LIM}$ based on the equation:

$$I_{LIM} = (V_{LIM} - V_{avgi} - V_{pi})/R_o$$

where $V_{LIM}$ refers to a selected operating voltage limit of the battery and $V_{pi}$ is the value of the polarization voltage $V_p$ corresponding to the loop count i. The value for $V_{LIM}$ may be one of the minimum operating voltage specification ($V_{min}$) and maximum operating voltage specification ($V_{max}$) of battery 20. Control then proceeds to block 416 and updates the polarization voltage $V_p$ based on the equation:

$$V_{pi} = V_{p(i-1)} + (I_{LIM} R_p - V_{p(i-1)}) |I| T/\tau$$

where $R_p$ can be estimated from lookup tables 66 based on battery temperature and/or battery SOC, $V_{p(i-1)}$ is the polarization voltage $V_p$ corresponding to the previous loop period, and T is a time constant that is experimentally determined based on the battery voltage V and the battery voltage limit $V_{LIM}$.

Control proceeds from block 416 to block 418 and determines a predicted battery power limit $P_{LIM}$ based on the equation:

$$P_{LIM} = I_{LIM} V_{LIM}$$

Control then proceeds to block 420 and communicates $P_{LIM}$ and/or $I_{LIM}$ values to the master control module 40. It should be appreciated that the values of $P_{LIM}$ and $I_{LIM}$ correspond to the selected battery voltage limit $V_{LIM}$. Method 400 can therefore be used to maintain values of $P_{LIM}$ and $I_{LIM}$ for corresponding values of $V_{min}$ and $V_{max}$.

The master control module 40 can use the $P_{LIM}$ and/or $I_{LIM}$ values to take appropriate action before the battery voltage V violates the selected battery voltage limit $V_{LIM}$. For example, in a hybrid electric vehicle, master control module 40 can start the vehicle engine to assist the batteries before the battery voltage V falls below the battery voltage limit $V_{LIM}$ when $V_{LIM}$ is set equal to $V_{min}$.

Figure 5:
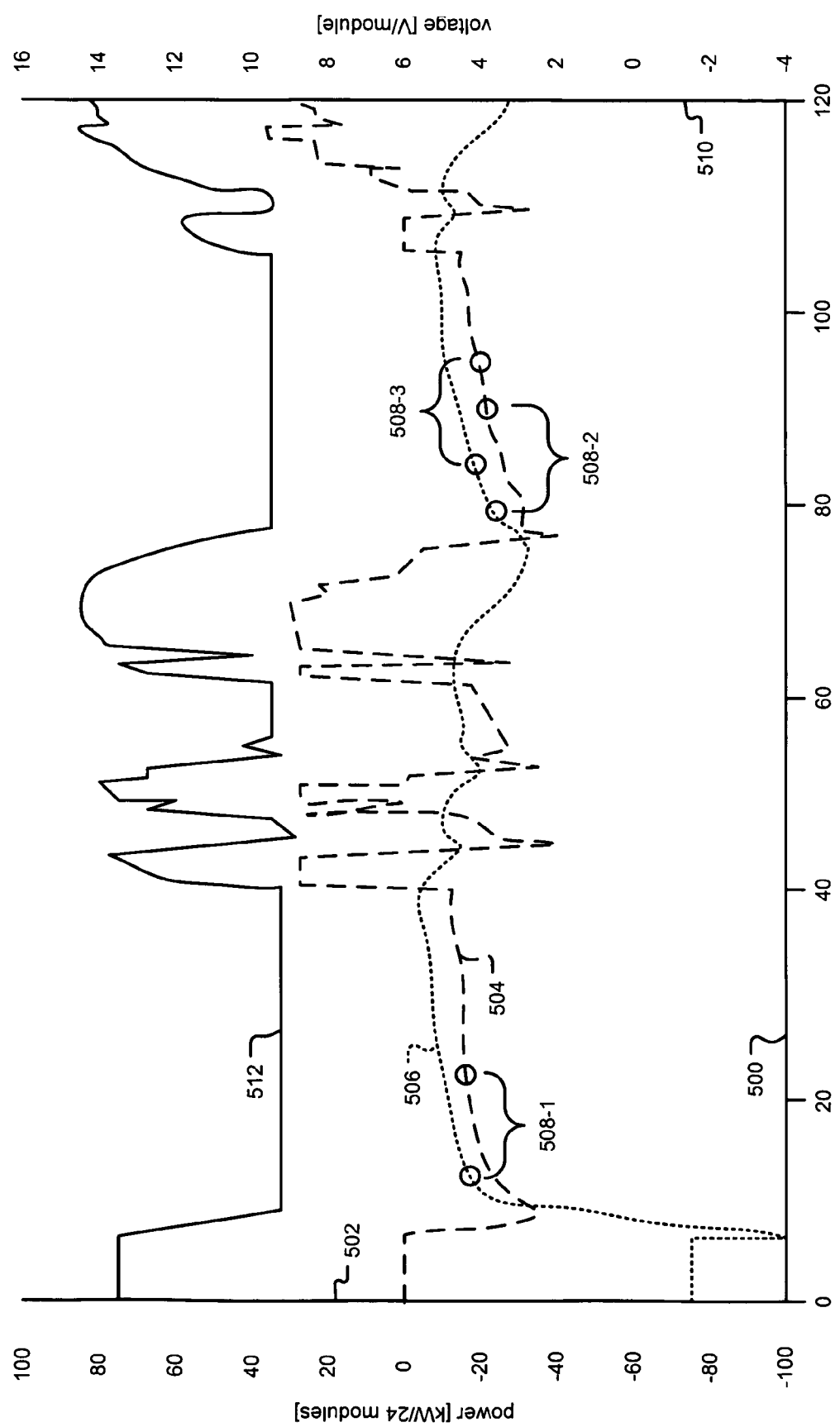
FIG. 5 is a graph of actual and predicted battery parameters.

Referring now to FIG. 5, a sample plot shows a comparison of the predicted battery power limit $P_{LIM}$ and the actual power delivered by batteries 20. The sample plot is taken from a hybrid vehicle application where the load power is shared between batteries 20 and an internal combustion engine. A horizontal axis 500 represents time in seconds. A left vertical axis 502 represents battery power. An upper half of left vertical axis 502 represents batteries 20 absorbing or regenerating power from the load. A lower half of left vertical axis 502 represents batteries 20 providing or discharging power into the load. A trace 504 represents load power and is referenced to the left vertical axis 502. A trace 506 represents the predicted battery power limit $P_{LIM}$ and is referenced to the left vertical axis 502. The predicted battery power limit $P_{LIM}$ was determined in accordance with method 400.

A first pair of points 508-1, a second pair of points 508-2, and third pair of points 508-3, collectively referred to a pairs of points 508, shows a relationship between the predicted battery power limit $P_{LIM}$ and the actual battery power. A left point in each pair of points 508 shows the predicted battery power limit $P_{LIM}$. A right point in each pair of points 508 indicates the actual power reaching the corresponding predicted battery power limit $P_{LIM}$.

A right vertical axis 510 is scaled in volts. The batteries used to generate the sample plot of FIG. 5 have a battery voltage limit $V_{LIM} = 9V$. A battery voltage trace 512 indicates the measured battery voltage V. The predicted battery power limit $P_{LIM}$ provides the master controller 40 with ample time to control load sharing between batteries 20 and the internal combustion engine, thereby keeping the measured battery voltage V above 9V.

Figure 6A:
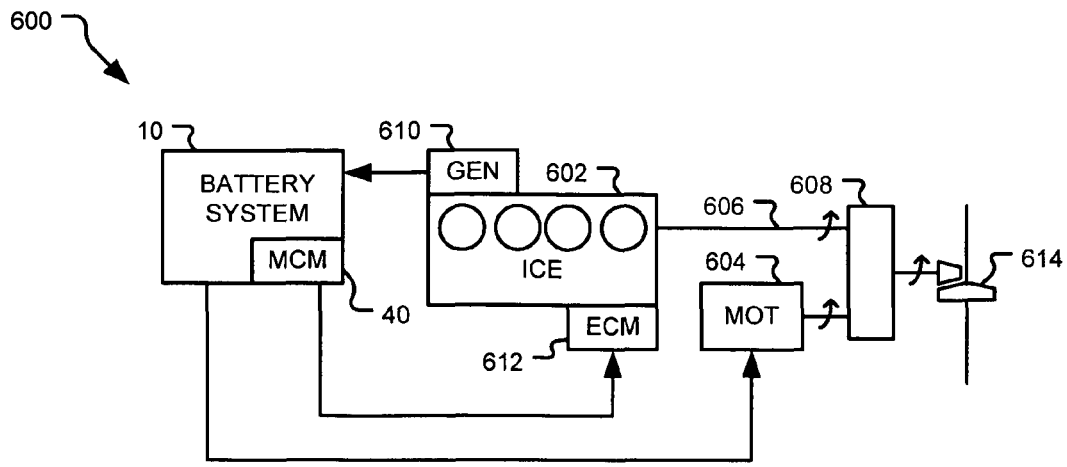
FIG. 6A-6C are functional block diagrams of hybrid electric vehicles.
Figure 6B:
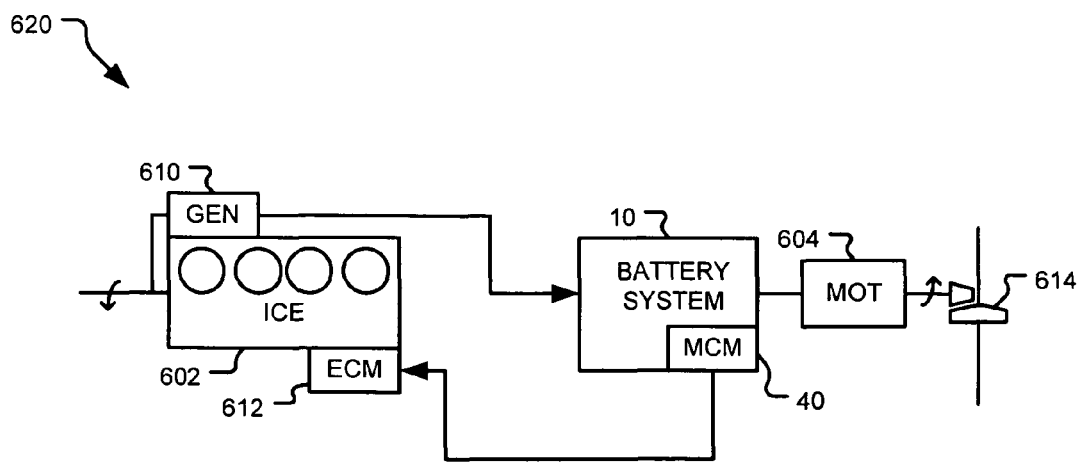
Figure 6C:
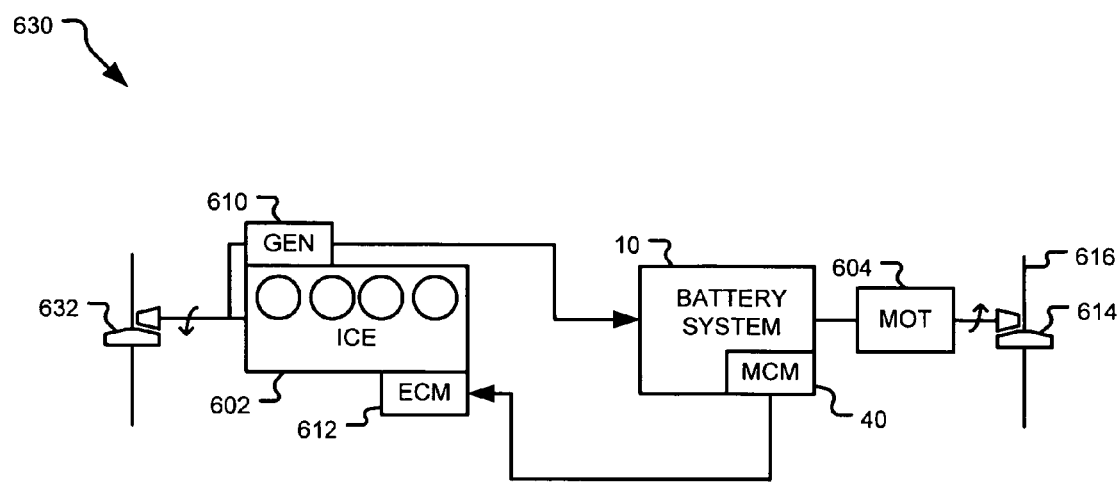

Referring now to FIGS. 6A-6C, various embodiments of hybrid electric vehicles (HEV) are shown. The present invention can be implemented in battery systems 10 incorporated in the HEVs. FIG. 6A depicts a functional block diagram of a parallel-architecture HEV 600. HEV 600 includes an internal combustion engine 602 and an electric motor 604. Internal combustion engine 602 includes an output shaft 606 that provides rotational power to a transmission 608. A generator 610 is driven by internal combustion engine 602 and provides a charging current to battery system 10. MCM 40 controls and/or sends a control signal to an electronic control module (ECM) 612. ECM 612 controls internal combustion engine 602 based on the control signal from MCM 40.

Electric motor 604 converts power from battery system 200 to mechanical power. The mechanical power is applied to an input shaft of transmission 608. Transmission 608 combines power from internal combustion engine 602 and electric motor 604 to provide power to a drive axle 614.

Referring now to FIG. 6B, a functional block diagram of a serial-architecture HEV 620 is shown. HEV 620 includes internal combustion engine 602 that drives generator 610. Generator 610 provides charging current to battery system 10. MCM 40 generates a control signal that is communicated to ECM 612. Electric motor 604 receives power from battery system 200.

Referring now to FIG. 6C, a functional block diagram of an indirect serial-architecture HEV 650 is shown. Internal combustion engine 602 provides power to a second drive axle 632 and generator 610. Generator 610 provides a charging current to battery system 10. Electric motor 604 provides power to drive axle 614. MCM 40 coordinates operation of internal combustion engine 602 and electric motor 604 to propel the vehicle.

Figure 7:
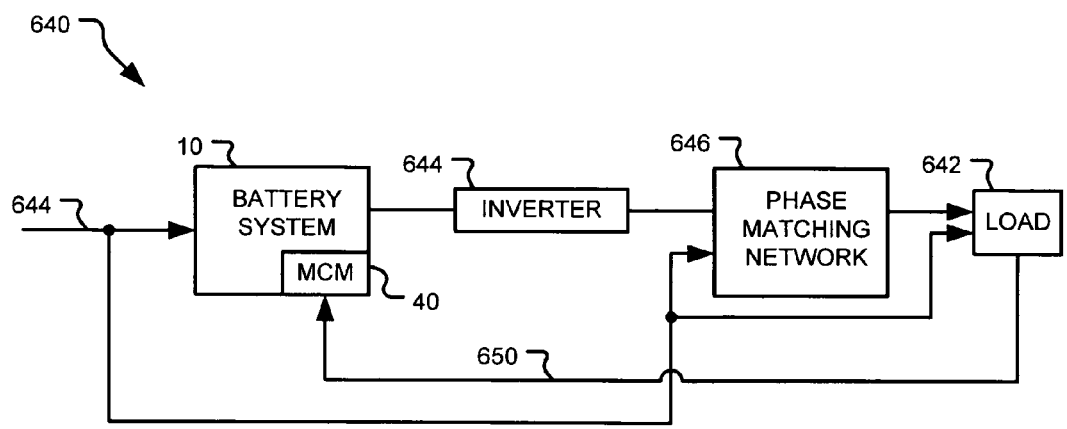
FIG. 7 is a functional block diagram of a battery-powered supplemental power supply.

Referring now to FIG. 7, a functional block diagram is shown of a supplemental power supply 640. A load 642 receives power from a utility line 644. Load 642 can also receive battery power from battery system 10. An inverter 644 converts the battery power to alternating current. A phase matching network 646 matches a phase of the power from inverter 644 and a phase of the power from utility line 644. MCM 40 can include an input 650 that monitors load 642 for power shortages. MCM 40 controls battery system 10 based on the power shortages.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A battery control module for use with a battery, the battery control module comprising:
   a voltage measuring module that measures voltages of the battery;
   a current measuring module that measures a battery current through the battery during a current time period; and
   a power limit module that communicates with the current and voltage measuring modules and that during a future time period estimates a battery current limit, wherein the future time period is subsequent to the current time period, and wherein the power limit module iteratively estimates the battery current limit,
   wherein the power limit module estimates the battery current limit during the future time period based on:
   a predetermined voltage limit of the battery;
   the battery current through the battery; and
   a battery voltage of the battery during a time period prior to the future time period.

2. The battery control module of claim 1 wherein the power limit module periodically estimates a power limit based on the battery current limit.

3. The battery control module of claim 1 wherein the power limit module:
   estimates a polarization voltage of the battery; and
   estimates the battery current limit based on the polarization voltage.

4. The battery control module of claim 3 wherein the power limit module initializes the polarization voltage to a predetermined value.

5. The battery control module of claim 3 wherein the power limit module estimates the polarization voltage and the battery current limit during each of a plurality of time periods; and
the plurality of time periods include the current time period, the future time period, and the time period prior to the future time period.

6. A hybrid power supply system for a load, the hybrid power supply system comprising:
a first power source that provides power to the load based on a power demand signal;
a rechargeable battery that provides power to the load; and
a control module in communication with the rechargeable battery, comprising:
a voltage measuring module that measures battery voltages of the rechargeable battery;
a current measuring module that measures battery currents through the rechargeable battery; and
a power limit module that communicates with the current and voltage measuring modules,
wherein the power limit module estimates a battery current limit during a predetermined time period based on one of the measured battery currents, a predetermined voltage limit of the rechargeable battery, and at least one of:
a running average over time of the measured battery voltages; and
one of the measured battery voltages measured during a time period prior to the predetermined time period, and
wherein the power limit module generates the power demand signal based on the battery current limit.

7. The hybrid power supply system of claim 6 wherein the power limit module estimates a power limit based on the battery current limit.

8. The hybrid power supply system of claim 6 wherein the power limit module estimates the battery current limit based on a polarization voltage of the rechargeable battery.

9. The hybrid power supply system of claim 6 wherein the first power source includes an internal combustion engine.

10. The hybrid power supply system of claim 6 wherein the first power source includes an electrical power supply.

11. A method for controlling current draw from a battery, the method comprising:
measuring battery voltages of the battery;
measuring battery currents through the battery; and
predicting a battery current limit during a predetermined time period, wherein the battery current limit represents a maximum allowable battery current through the battery,
wherein the battery current limit is based on:
one of the measured battery currents;
a predetermined voltage limit of the battery; and
at least one of:
a running average over time of the measured battery voltages; and
one of the measured battery voltages measured during a time period prior to the predetermined time period.

12. The method of claim 11 further comprising estimating a maximum power that the battery can deliver based on the battery current limit.

13. The method of claim 11 further comprising predicting the battery current limit based on a polarization voltage of the battery.

14. A method for controlling a hybrid power supply system, the method comprising:
operating a first power source to provide power to a load based on a power demand signal;
supplying power to the load from a rechargeable battery;
measuring battery voltages of the rechargeable battery;
measuring battery currents through the rechargeable battery;
estimating a battery current limit during a predetermined time period, wherein the battery current limit represents a maximum allowable battery current through the battery; and
generating the power demand signal based on the estimated battery current limit,
wherein the battery current limit is estimated based on:
one of the measured battery currents;
a first one of the measured battery voltages, wherein the one of the measured battery currents and the first one of the measured battery voltages are measured during the predetermined time period,
a predetermined voltage limit of the battery, and
at least one of:
a running average over time of the measured battery voltages including the first one of the measured battery voltages measured during the predetermined time period; and
a second one of the measured battery voltages measured during a time period prior to the predetermined time period.

15. The method of claim 14 further comprising estimating a maximum power of the battery based on the estimated battery current limit.

16. The method of claim 14 wherein the battery current limit is estimated based on a polarization voltage of the battery.

17. The method of claim 16 further comprising initializing the polarization voltage to a predetermined value.

18. The method of claim 16 further comprising estimating the polarization voltage and the battery current limit during each of a plurality of time periods,
wherein the plurality of time periods include the predetermined time period and the time period prior to the predetermined time period.

19. The method of claim 14 wherein the first power source includes at least one of an internal combustion engine and an electrical power supply.

20. A powertrain system for a hybrid electric vehicle, the powertrain system comprising:
a rechargeable battery that provides power to an electric motor for propelling the vehicle;
an internal combustion engine that generates power for propelling the vehicle;
an engine controller that starts the internal combustion engine in response to a power demand signal; and
a control module in communication with the rechargeable battery and comprising:
a voltage measuring module that measures a battery voltage of the rechargeable battery during a time period prior to a predetermined time period;
a current measuring module that measures a battery current through the rechargeable battery; and
a power limit module that communicates with the current and voltage measuring modules,
wherein the power limit module determines a battery current limit during the predetermined period and based on the battery current and the battery voltage; and
wherein the power limit module generates the power demand signal based on the battery current limit such that the engine controller starts the internal combustion engine prior to the predetermined period.

21. The battery control module of claim 1, wherein the time period prior to the future time period is one of the current time period and a time period prior to the current time period.

22. The hybrid power supply system of claim 6, wherein:
the power limit module estimates the battery current limit during the predetermined time period based on one of the measured battery voltages measured during the time period prior to the predetermined time period; and
the one of the measured battery voltages measured during the time period prior to the predetermined time period is a polarization voltage of the rechargeable battery.

23. The hybrid power supply system of claim 6, wherein:
the power limit module estimates the battery current limit during the predetermined time period based on the running average over time of the measured battery voltages; and
the control module determines the running average over time of the measured battery voltages based on:
a running average over time of measured battery voltages during the time period prior to the predetermined time period;
a value between zero and one; and
the battery voltage measured during the predetermined time period.

24. The hybrid power supply system of claim 6, wherein the power limit module estimates the battery current limit based on:
the one of the measured battery currents measured during the predetermined time period;
a resistance of the rechargeable battery; and
a time constant that is based on (i) one of the measured battery voltages measured during the predetermined time period, and (ii) a voltage limit of the rechargeable battery,
wherein the one of the measured battery voltages is a polarization voltage.

* * * * *

UNITED STATES PATENT AND TRADEMARK OFFICE
CERTIFICATE OF CORRECTION

PATENT NO. : 8,466,684 B2  
APPLICATION NO. : 11/455297  
DATED : June 18, 2013  
INVENTOR(S) : Robert J. Melichar Page 1 of 1

It is certified that error appears in the above-identified patent and that said Letters Patent is hereby corrected as shown below:

In the Specifications

| | |
|---|---|
| Column 2, Line 38 | After "battery", insert --.-- |
| Column 3, Line 11 | Delete "FIG." and insert --FIGS.-- |
| Column 3, Line 62 | Delete "sensing" and insert --measuring-- |
| Column 4, Line 37 | Delete "mS" and insert --ms-- |
| Column 4, Line 46 | Before "measured", delete "the" |
| Column 5, Line 20 | Delete "$V_{LIM}$." and insert --$V_{LIM}$,-- |
| Column 5, Line 66 | Delete "200" and insert --10-- |
| Column 6, Line 10 | Delete "200" and insert --10-- |
| Column 6, Line 12 | Delete "650" and insert --630-- |

Signed and Sealed this  
Third Day of September, 2013

Teresa Stanek Rea  
*Acting Director of the United States Patent and Trademark Office*